United States Patent
Neidorff

(10) Patent No.: US 6,646,513 B1
(45) Date of Patent: Nov. 11, 2003

(54) OSCILLATOR CIRCUIT HAVING AN IMPROVED CAPACITOR DISCHARGE CIRCUIT

(75) Inventor: Robert Alan Neidorff, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/229,486

(22) Filed: Aug. 28, 2002

(51) Int. Cl.[7] .................................................. H03K 3/02
(52) U.S. Cl. ....................................... 331/143; 331/111
(58) Field of Search .................................. 331/111, 143, 331/176

(56) References Cited

U.S. PATENT DOCUMENTS

| | | | |
|---|---|---|---|
| 5,670,915 A | * | 9/1997 | Cooper et al. ............... 331/111 |
| 5,912,593 A | | 6/1999 | Susak et al. |
| 5,990,753 A | | 11/1999 | Danstrom et al. |
| 6,020,792 A | * | 2/2000 | Nolan et al. ................ 331/111 |
| 6,362,697 B1 | | 3/2002 | Pulvirenti |
| 6,373,343 B1 | | 4/2002 | Baldwin et al. |

* cited by examiner

Primary Examiner—Kenneth B. Wells
(74) Attorney, Agent, or Firm—April M. Mosby; Wade James Brady III; Frederick J. Telecky, Jr.

(57) ABSTRACT

An oscillator circuit (300) disclosed herein includes an improved capacitor discharge circuit. The oscillator includes at least one capacitor coupled to a charging circuit portion (202, 210) and a discharging circuit portion (208) through a switching network (204, 216, 218, 220 and 222). In the alternative, an oscillator including more than one capacitor includes respective charging and discharging circuit portions connected to respective switching networks. Each charging circuit portion (202, 210) provides sufficient charge to charge the coupled capacitor (206) to a high threshold voltage ($V_{tH}$). Each discharging circuit portion (208) discharges each coupled capacitor (206) to a low threshold voltage ($V_{tL}$). The switching network alternately connects each coupled capacitor (206) to the charging circuit portion (202, 210) and the discharging circuit portion (208) to thereby alternately charge and discharge for each coupled capacitor (206) alternately. A set/reset flip-flop (214) connected to the switching network (204, 216, 218, 220 and 222) enables and disenables the charging cycle and the discharge cycle of the oscillator 200.

15 Claims, 2 Drawing Sheets

OSCILLATOR CIRCUIT HAVING AN IMPROVED CAPACITOR DISCHARGE CIRCUIT

FIELD OF THE INVENTION

The present invention relates to oscillators, and, more particularly, to an oscillator having an improved capacitor discharge circuit.

BACKGROUND OF THE INVENTION

Conventional oscillator circuits provide clock and other timing signals as a frequency reference in electronic circuitry such as pulse width modulation (PWM) power converters, microprocessors, microcontrollers, flip-flop circuits, latch circuits, etc. A digital system may include one or more microprocessors, bus controllers, peripheral controllers, memory, and peripherals, such as disk drives, all of which may typically be synchronized from one system clock such as a precision clock signal generated by an oscillator. Precision clock signals are widely used in digital circuits to synchronize the activities of all circuits in the system, whether the system is simple or complex.

Typical oscillator circuits include a control circuit coupled to a switch-capacitor network, such that the control circuit alternately charges or discharges the voltage across the capacitor to generate an oscillatory signal appearing across the capacitor. The frequency of oscillation is determined by the rise and fall time of the charging and discharging of the capacitor.

One approach, as shown in FIG. 1, includes a set/reset (SR) flip-flop 110 and first and second comparators, 106 and 108. The interconnection between the capacitor 116 is coupled to one input of each of the comparators, 106 and 108. The other input of the first comparator 106 is coupled to receive a high threshold voltage $V_{tH}$, while the other input of the second comparator 108 is coupled to receive a low threshold voltage $V_{tL}$. The output of the first comparator 106 is coupled to the set input of the flip-flop 110, while the output of the second comparator 108 is coupled to the reset input of the flip-flop 110. An output of the flip-flop 110 is coupled to a first switch 112 that is coupled between capacitor 116 and a high current supply 102, where the high current supply 102 couples between the power supply rail and the first switch 112. The inverted output of the flip-flop 110 is coupled to a second switch 114 that is coupled between a low current supply 104 and ground, where the low current supply 104 couples between capacitor 116 and the second switch 114.

In operation, the first comparator 106 sets flip-flop 110, which commences the discharging of the voltage across capacitor 116, when the stored charge of capacitor 116 exceeds the predetermined high threshold voltage $V_{tH}$, and the second comparator 108 resets flip-flop 110, which commences the charging of the voltage across capacitor 116, when the stored charge of capacitor 116 falls below the predetermined low threshold voltage $V_{tL}$. In this manner, the signal appearing across capacitor 116 approximately oscillates between the high and the low threshold voltages, $V_{tH}$ and $V_{tL}$, at a frequency determined by the value of capacitor 116 of the switch-capacitor network.

At times, this configuration, however, provides an unreliable oscillatory signal in that when flip-flop 110 is set in response to the switching of comparator 106, the oscillatory signal may have actually risen above the high threshold voltage $V_{tH}$ due to a delay in the first comparator 106. In the alternative, when flip-flop 110 is reset in response to the switching of comparator 108, the oscillatory signal may have actually fallen below the low threshold voltage $V_{tL}$ due to a delay in the second comparator 108. As a result, variations in the frequency of oscillation occur because the oscillatory signal does not accurately oscillate between the desired high and low threshold voltages, $V_{tH}$ and $V_{tL}$. In most digital systems, where accuracy is a requirement, this type of error is unacceptable.

Specifically, in a PWM power converter application, the oscillator sets the operating frequency of the switching converter in the PWM power converter. In this particular application, the oscillator typically has a slow rising waveform on the capacitor 116 and a fast falling waveform on the same capacitor 116 such that the on-time for the PWM converter is longer than the off-time, where the on-time is set by the time for capacitor 116 to charge with the small current from current supply 102 and the off-time is set by the time to discharge capacitor 116 using a large current from current supply 104.

In this application, a slight delay in the first comparator 106 may not cause problems; however, a slight delay in the second comparator 108 can result in substantial undershoot and poor control of the off-time of the PWM converter. The high current of current source 104 used to discharge capacitor 116 requires comparator 108 respond immediately to the voltage of capacitor 116 and turn off the discharge cycle by resetting flip-flop 110. As such, the efficiency of oscillator 100 relies heavily upon whether comparator 108 is fast and has an accurate threshold and whether no time delays exist in the feedback loop which turns off the discharge cycle.

Known approaches, in an effort to solve the inaccuracy in the oscillatory signal, place effort into increasing the efficiency of the second current source 104 or place effort into designing a faster flip-flop 110 or a faster comparator 108. Moreover, other approaches place effort into designing more efficient switches 112 and 114 rather.

Yet, there still exists a need to provide an improved oscillator that eliminates the voltage overshoot or undershoot in the oscillatory signal that is not dependent upon the increased response time of the flip-flop or comparators nor dependent upon the enhanced efficiency of the switches or current sources.

SUMMARY OF THE INVENTION

To address the above-discussed deficiencies of known oscillators, the resent invention teaches an oscillator circuit having an improved capacitor discharge circuit. The first embodiment includes a first capacitor coupled to a charging circuit portion and a discharging circuit portion through a switching network. The charging circuit portion provides sufficient charge to charge the first capacitor to a high threshold voltage. The discharging circuit portion discharges the first capacitor to a low threshold voltage. The switching network alternately connects the first capacitor to the charging circuit portion and the discharging circuit portion to thereby alternately charge and discharge the first capacitor. A set/reset flip-flop is utilized to enable and disenable the charging cycle and the discharge cycle of the capacitor.

In a second embodiment, the oscillator includes a first capacitor, a first charging circuit portion, a first discharging circuit portion, and a first switching network for alternately coupling the first capacitor to the first charging circuit portion and the first discharging circuit portion. The first charging circuit portion charges the first capacitor to a high threshold voltage. The oscillator also includes a second capacitor, a second charging circuit portion and a second switching network for alternately coupling the second capacitor to the second charging circuit portion and ground such that the second capacitor charges while the first capacitor discharges and the second capacitor discharges while the first capacitor charges. The second charging circuit portion charges the second capacitor to a low threshold voltage. A set/reset flip-flop is utilized to enable and disenable the charging cycle and the discharge cycle for the first and second capacitor, alternately.

The capacitor discharge circuit in both embodiments in accordance with the present invention does not use an uncontrolled discharge current or a comparator to discharge the capacitor to a predetermined voltage. Instead, this invention uses a second capacitor charged to the opposite voltage of the first capacitor placed in parallel across the first capacitor to discharge the first capacitor. This will always discharge the first capacitor to exactly an efficient starting voltage while the third capacitor is used to facilitate the off-time.

Advantages of this design include but are not limited to a capacitor discharge circuit having a second capacitor to quickly discharge the main capacitor rather than a discharge transistor.

BRIEF DESCRIPTION OF THE DRAWINGS

For a more complete understanding of the present invention and the advantages thereof, reference is now made to the following description taken in conjunction with the accompanying drawing in which like reference numbers indicate like features and wherein.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set for the herein. Rather, these embodiments are provided so that this disclosure will be thorough and complete, and will fully convey the scope of the invention to those skilled in the art.

Figure 1:
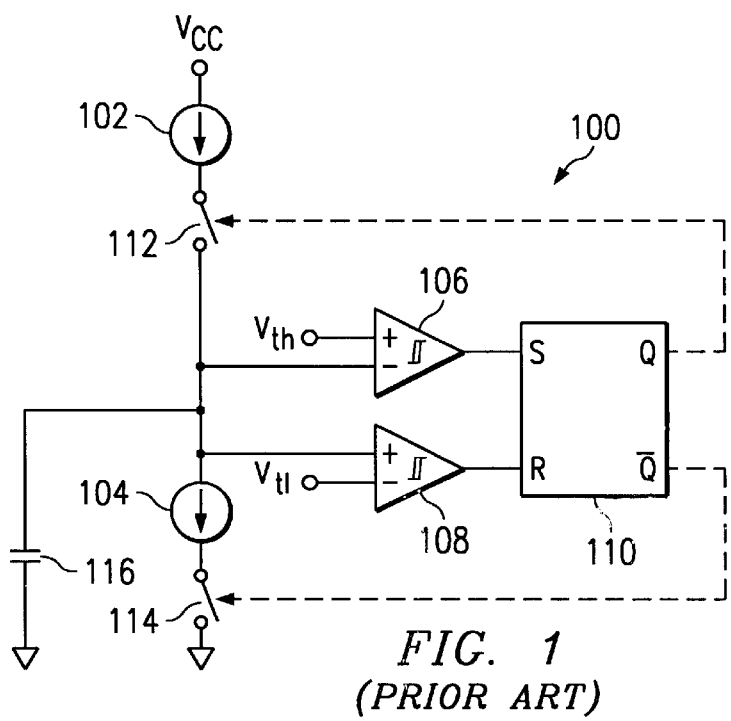
FIG. 1 illustrates a known oscillator.
Figure 2:
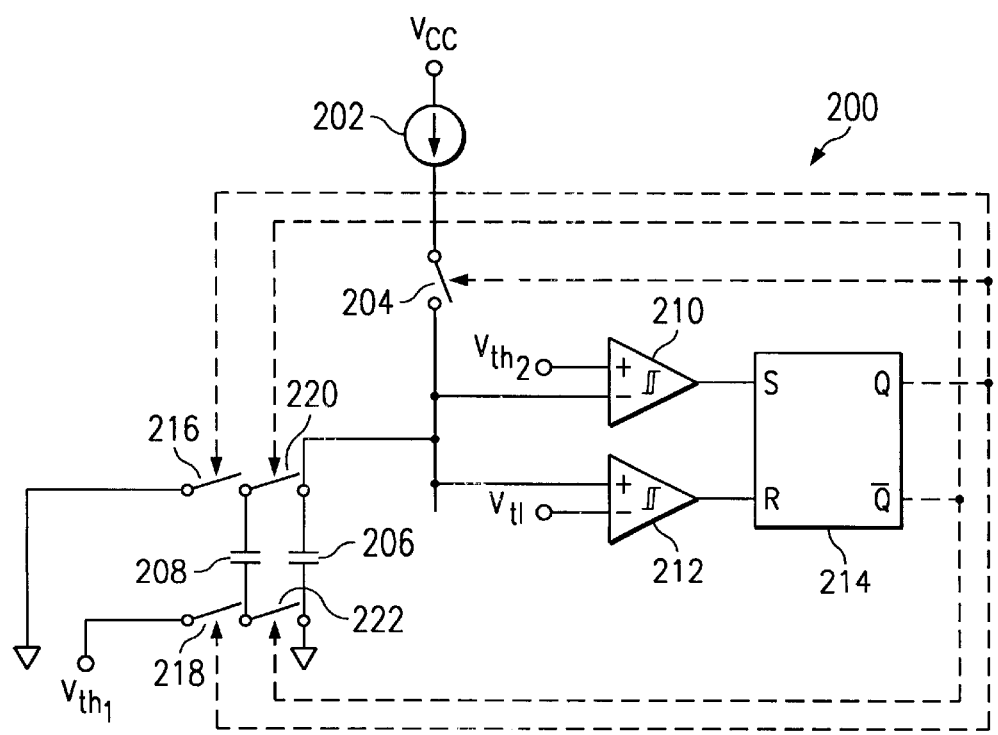
FIG. 2 displays a first embodiment of an oscillator in accordance with the present invention.

FIG. 2 displays an oscillator 200 in accordance with the present invention. Oscillator 200 includes a first capacitor 206 coupled to a charging circuit portion and a discharging circuit portion through a switching network. The switching network includes a charging switch network and a discharging switch network. The switching network alternately connects the first capacitor 206 to the charging circuit portion and the discharging circuit portion to thereby alternately charge and discharge the first capacitor. A set/reset flip-flop 214 is utilized to enable and disenable the charging cycle and the discharge cycle of the capacitor 206.

Specifically, during the charging cycle, the charging circuit portion provides sufficient charge to charge the first capacitor 206 to a second high threshold voltage $V_{tH2}$. The charging circuit portion includes charging current source 202 and charging comparator 210 both of which couple to the first capacitor 206. The charging current source 202 charges capacitor 206, while the charging comparator 210 compares the charge stored in capacitor 206 with the second high voltage threshold $V_{tH2}$. The charging current source 202 and the charging comparator 210 only couple to capacitor 206 through the charging switch network which includes in the embodiment a first switch 204 coupled between the charging circuit portion and capacitor 206. The charging switch network also includes a second switch 216 connecting the discharging circuit portion to ground and a third switch 218 connecting capacitor 208 to a node having a first high threshold voltage $V_{tH1}$. The second and third switches, 216 and 218, are controlled by the output of a set-reset flip-flop 214.

In operation, during a charging cycle, switches 216, 218 and 204 close after flip-flop 214 sends a high on the output Q. Immediately capacitors 206 and 208 begin charging. Capacitor 206 charges to a voltage determined by the charging current source 202, while capacitor 208 charges to the negative value of the first high threshold voltage $-V_{tH1}$ Simultaneously, charging comparator 210 compares the voltage across capacitor 206 with the second high threshold voltage $V_{tH2}$. If the charge across capacitor 206 is greater than or equal to the second high threshold voltage $V_{tH2}$, then the charging comparator 210 sets flip-flop 214 such that a low is at output Q and a high at the inverted output ~Q to enable the discharging cycle.

During the discharging cycle, the discharging circuit portion discharges the first capacitor 206 to a low threshold voltage $V_{tL}$. Specifically, the discharging circuit portion includes second capacitor 208 and a discharging comparator 212. The second capacitor 208, through the discharging switch network, couples in parallel with the first capacitor 206, wherein the second capacitor 208 is charged to the negative value of the first high threshold voltage $-V_{tH1}$. The discharge switch network includes switches, 220 and 222, which couple capacitor 208 in parallel with capacitor 206. In operation, since the second capacitor 208 is charged to the negative value of the first high threshold voltage $-V_{tH1}$, the first capacitor 206 discharges. The discharging comparator 212 compares the charge stored in capacitor 206 with a low threshold voltage $V_{tL}$ while capacitor 206 discharges. When capacitor 206 is at a voltage less than or equal to the lower threshold voltage $V_{tL}$, discharging comparator 212 resets flip-flop 214. The output Q of flip-flop 214 will be high to initiate another charging cycle. The charging and discharging cycles repeat alternately to provide the oscillatory signal which is the voltage signal across capacitor 206.

Figure 3:
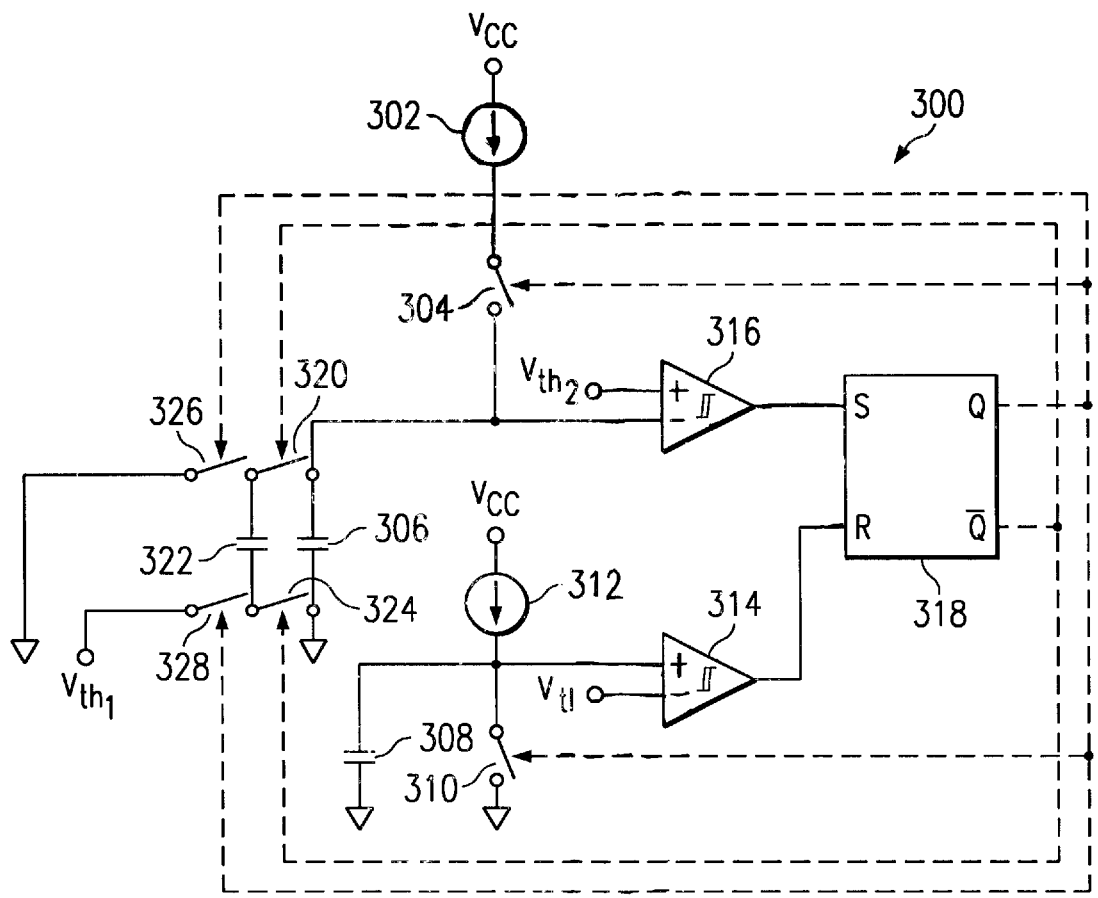
FIG. 3 shows a second embodiment of an oscillator in accordance with the present invention.

A second embodiment, oscillator 300, as shown in FIG. 3, includes a first capacitor 306, a first charging circuit portion, a first discharging circuit portion, and a first switching network for alternately coupling the first capacitor to the first charging circuit portion and the first discharging circuit portion. The first switching network includes a charging switch network and a discharging switch network. The first charging circuit portion for charging the first capacitor 306 to a high threshold voltage. In addition, oscillator 300 includes a second capacitor 308, a second charging circuit portion and a second switching network for alternately coupling the second capacitor 308 to the second charging circuit portion and ground. The second charging circuit portion for charging the second capacitor 308 to a low threshold voltage $V_{tL}$. A set/reset flip-flop 318 enables and disenables the charging cycle and the discharge cycle for the first and second capacitor, 306 and 308. The first and second switching networks are arranged such that the first capacitor 306 charges while the second capacitor 308 discharges and the first capacitor 306 discharges while the second capacitor 308 charges.

Specifically, during the charging cycle, the first charging circuit portion provides sufficient charge to charge the first capacitor 306 to the second high threshold voltage $V_{tH2}$. The first charging circuit portion includes charging current source 302 and charging comparator 316 both of which couple to the first capacitor 306 through the second switching network. The charging current source 302 charges capacitor 306, while the charging comparator 316 compares the charge stored in capacitor 306 with the second high voltage threshold $V_{tH2}$. The charging current source 302 and the charging comparator 316 only couple to capacitor 306 through the charging switch network which includes in this embodiment a first switch 304 coupled between the charging circuit portion and capacitor 306. The charging switch network also includes a second switch 326 connecting the discharging circuit portion to ground and a third switch 328 connecting the discharging circuit portion to a node having the first high threshold voltage $V_{tH1}$. The discharging circuit portion includes a third capacitor 322 that is charged to a voltage that is the negative of the first high threshold voltage $-V_{tH}$, during the charging cycle. The discharging switch network includes a first switch 320 and a second switch 322 connecting capacitor 322 in parallel to capacitor 306, wherein the second capacitor 322 is charged to the negative value of the first high threshold voltage $-V_{tH1}$. The second and third switches, 326 and 328, are controlled by the output of a set-reset flip-flop 318.

In operation, during the charging cycle of capacitor 306, switches 304, 310, 326 and 328 close after flip-flop 318 sends a high on the output Q. Immediately capacitors 306 and 322 begin charging in opposite charge, respectively; while capacitor 308 discharges to ground. Capacitor 306 charges to a voltage determined by the charging current source 302, while capacitor 322 charges to a voltage that is the negative of the first high threshold voltage $-V_{tH1}$. Simultaneously, charging comparator 316 compares the voltage across capacitor 306 with the second high threshold voltage $V_{tH2}$. If the charge across capacitor 306 is greater than or equal to the second high threshold voltage $V_{tH2}$, then the charging comparator 316 sets flip-flop 318 such that a low is at output Q and a high at the inverted output ~Q to enable the discharging cycle of capacitor 306 and the charging cycle of capacitor 310.

The second charging circuit portion includes a charging current source 312 connected between a power supply voltage and the second capacitor 308 to charge the second capacitor 308 to the low threshold voltage $V_{tL}$. In addition the second charging circuit portion includes charging comparator 314 coupled to capacitor 308 to compare the voltage across capacitor 308 with a low threshold voltage $V_{tL}$. In operation, during a charging cycle for capacitor 308, switch 310 opens such that capacitor 308 is charged to the low threshold voltage $V_{tL}$.

During the discharge cycle of capacitor 306, switches 320 and 322 close, while switches 310, 326, 328 and 304 open. Since the third capacitor 322 is charged to the negative value of the first high threshold voltage $-V_{tH1}$, the first capacitor 306 begins to discharge. Capacitor 308 coupled to ground begins to charge to a second supply voltage. Simultaneously, the discharging comparator 314 compares the charge stored in capacitor 308 with the low threshold voltage $V_{tL}$ while capacitor 308 charges. When voltage across capacitor 308 is at a voltage equal to the lower threshold voltage $V_{tL}$, discharging comparator 314 resets flip-flop 318, such that the output Q of flip-flop 318 becomes high to initiate the charging cycle of capacitor 306. The charging and discharging cycles repeat for each capacitor, 306 and 308, alternately to provide the oscillatory signal which is the voltage signal across capacitor 306.

The on-time of oscillator 300, when the ramp of the voltage across capacitor 306 is positive, is determined by the amount of time it takes for capacitor 306 to charge to the second high threshold voltage $V_{tH2}$. The off-time of oscillator 300, when the ramp of the voltage across capacitor 308 is negative, is the amount of time it takes for capacitor 308 to charge to the low threshold voltage $V_{tL}$. Thus, the frequency of the oscillator 300 is the inverse of the sum of the time that it takes to charge capacitors 306 and 308.

The advantage of the circuit is that oscillator frequency is independent of time that switches 304 and 310 are on. The discharge of capacitor 308 is only determined by the voltage $V_{tL}$ and the ratio of capacitors 306 and 322.

Accordingly, a third embodiment may include a logic delay connected between switches 320 and 324 and the inverted output ~Q of flip-flop 318, such that switches 320 and 324 close after switches 326 and 328 open. This will eliminate any possibility of capacitor 322 discharging prematurely.

Those of skill in the art will recognize that the physical location of the elements illustrated in FIGS. 2 and 3 can be moved or relocated while retaining the function described above.

Advantages of this design include but are not limited to an oscillator having a high performance, simple, and cost effective design.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. An oscillator for generating an oscillating signal, comprising:
   a first capacitor;
   a charging circuit portion for charging the first capacitor to a first high threshold voltage;
   a discharging circuit portion including a second capacitor for discharging the first capacitor to a low threshold voltage;
   a switching network to alternately connect the first capacitor to the charging circuit portion and the discharging circuit portion to thereby alternately charge and discharge the first capacitor;
   a set-reset flip flop, having a set input, a reset input, an output, and an inverted output, the set input coupled to the charging circuit portion, the reset input coupled to the discharging circuit portion, the output coupled to the switching network to control the charging of the first capacitor, the inverted output coupled to the switching network to control the discharging of the first capacitor.

2. An oscillator as recited in claim 1, wherein the charging circuit portion comprises:
   a charging current source coupled to the first capacitor to charge the first capacitor to the first high threshold voltage; and
   a charging comparator coupled to the first capacitor and coupled to receive the first high threshold voltage to compare the charge of the first capacitor to the first high threshold voltage.

3. An oscillator as recited in claim 1, wherein the switching network includes a charging and a discharging switch network coupled to the first capacitor.

4. An oscillator as recited in claim 1, wherein the charging switch network comprises:
   a first switch coupled between the charging circuit portion and the first capacitor, the first switch controlled by the output of the set-reset flip-flop;
   a second switch coupled between ground and the discharging circuit portion, the second switch controlled by the output of the set-reset flip-flop; and
   a third switch coupled between a second high voltage threshold and the discharging circuit portion to charge the second capacitor opposite that of the first high threshold voltage, the third switch controlled by the output of the set-reset flip-flop.

5. An oscillator as recited in claim 3, wherein the discharging switch network comprises:
   a first switch coupled between the first capacitor and the second capacitor, the first switch controlled by the inverted output of the set-reset flip-flop; and
   a second switch coupled between the first capacitor and the second capacitor at the end opposite of the first switch coupling such that the first and second capacitor couple in parallel, the second switch controlled by the inverted output of the set-reset flip-flop.

6. An oscillator for generating an oscillating signal, comprising:
   a first capacitor;
   a first charging circuit portion for charging the first capacitor to a first high threshold voltage;
   a first discharging circuit portion for discharging the first capacitor;
   a first switching network to alternately connect the first capacitor to the charging circuit portion and the discharging circuit portion to thereby alternately charge and discharge the first capacitor;
   a second capacitor;
   a second charging circuit portion for charging the second capacitor to a low threshold voltage;
   a second switching network to alternately connect the second capacitor to the charging circuit portion and the discharging circuit portion to thereby alternately charge and discharge the second capacitor such that the first capacitor charges while the second capacitor discharges and the first capacitor discharges while the second capacitor charges; and
   a set-reset flip flop, having a set input, a reset input, an output, and an inverted output, the set input coupled to the first charging circuit portion, the reset input coupled to the second discharging circuit portion, the output coupled to the first switching network to control the charging of the first capacitor, the output coupled to the second switching network to control the charging and the discharging of the second capacitor, the inverted output coupled to the first switching network to control the discharge of the first capacitor.

7. An oscillator as recited in claim 6, wherein the first charging circuit portion comprises:
   a charging current source coupled to the first capacitor to charge the first capacitor to the first high threshold voltage; and
   a charging comparator coupled to the first capacitor and coupled to receive the first high threshold voltage to compare the charge of the first capacitor to the first high threshold voltage.

8. An oscillator as recited in claim 6, wherein the first discharging circuit portion comprises a third capacitor.

9. An oscillator as recited in claim 8, wherein the first switching network comprises a charging and a discharging switch network coupled to the first capacitor.

10. An oscillator as recited in claim 9, wherein the charging switch network comprises:
    a first switch coupled between the charging current source and the first capacitor, the first switch controlled by the output of the set-reset flip-flop;
    a second switch coupled between ground and the first discharging circuit portion, the second switch controlled by the output of the set-reset flip-flop; and
    a third switch coupled between a second high voltage threshold and the first discharging circuit portion to charge the third capacitor opposite the first high threshold voltage, the third switch controlled by the output of the set-reset flip-flop.

11. An oscillator as recited in claim 9, wherein the discharging switch network comprises:
    a first switch coupled between the first capacitor and the third capacitor, the first switch controlled by the inverted output of the set-reset flip-flop; and
    a second switch coupled between the first capacitor and the third capacitor at the end opposite of the first switch coupling such that the first and third capacitor couple in parallel, the second switch controlled by the inverted output of the set-reset flip-flop.

12. An oscillator as recited in claim 6, wherein the second charging circuit portion comprises:
    a charging current source coupled to the second capacitor to charge the second capacitor to the power supply voltage; and
    a charging comparator coupled to the second capacitor and coupled to receive a low threshold voltage to compare the charge of the second capacitor to the low threshold voltage.

13. An oscillator as recited in claim 6, wherein the second switching network comprises a switch coupled between the second capacitor and ground.

14. A method of generating an oscillating signal, comprising the steps of:
    a. charging a first capacitor to a first supply voltage;
    b. charging a second capacitor to the negative value of a high threshold voltage;
    c. comparing the voltage across the first capacitor with the high threshold voltage;
    d. discharging the first capacitor when the voltage across the first capacitor is greater than or equal to the high threshold voltage by coupling the second capacitor in parallel to the first capacitor;

e. comparing the voltage across the first capacitor with a low threshold voltage;

f. charging the first capacitor when the voltage across the first capacitor is less than or equal to the low threshold voltage; and g. repeating steps a through f.

15. A method of generating an oscillating signal, comprising the steps of:

a. charging a first capacitor to a first supply voltage;

b. discharging a second capacitor to ground;

c. charging a third capacitor to the negative value of a first high threshold voltage;

d. comparing the voltage across the first capacitor with a second high threshold voltage;

e. discharging the first capacitor and the third capacitor when the voltage across the first capacitor is greater than or equal to the second high threshold voltage by coupling the third capacitor in parallel to the first capacitor;

f. charging the second capacitor to a second supply voltage;

g. comparing the voltage across the second capacitor with a low threshold voltage; and h. repeating steps a through g when the voltage across the second capacitor is more than or equal to the low threshold voltage.

* * * * *